United States Patent
Raff

(10) Patent No.: US 11,132,029 B2
(45) Date of Patent: Sep. 28, 2021

(54) TRIMLESS GLASS ENCLOSURE INTERFACE

(71) Applicant: Apple Inc., Cupertino, CA (US)

(72) Inventor: John Raff, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/708,231

(22) Filed: Dec. 9, 2019

(65) Prior Publication Data

US 2020/0110446 A1 Apr. 9, 2020

Related U.S. Application Data

(63) Continuation of application No. 15/887,961, filed on Feb. 2, 2018, now Pat. No. 10,534,403, which is a continuation of application No. 15/060,490, filed on Mar. 3, 2016, now Pat. No. 9,886,065, which is a continuation of application No. 14/668,799, filed on Mar. 25, 2015, now Pat. No. 9,285,833, which is a continuation of application No. 13/908,970, filed on Jun. 3, 2013, now Pat. No. 9,047,044.

(60) Provisional application No. 61/715,970, filed on Oct. 19, 2012.

(51) Int. Cl.
*G06F 1/16* (2006.01)
*H04M 1/02* (2006.01)
*H05K 5/02* (2006.01)

(52) U.S. Cl.
CPC .............. *G06F 1/1656* (2013.01); *G06F 1/16* (2013.01); *G06F 1/1626* (2013.01); *G06F 1/1637* (2013.01); *H04M 1/0266* (2013.01); *H05K 5/0217* (2013.01); *Y10T 156/10* (2015.01)

(58) Field of Classification Search
CPC ........ H05K 5/04; G06F 1/1626; G06F 1/1656
See application file for complete search history.

(56) References Cited

U.S. PATENT DOCUMENTS

| | | |
|---|---|---|
| 4,129,671 A | 12/1978 | Greenberg |
| 8,199,477 B2 | 6/2012 | Mathew et al. |
| 8,437,131 B2 | 5/2013 | Dai et al. |
| 8,592,693 B2 | 11/2013 | Dai |
| 8,594,755 B1 | 11/2013 | Tages et al. |
| 8,737,045 B2 | 5/2014 | Dai et al. |
| 9,047,044 B2 | 6/2015 | Raff |
| 9,285,833 B2 | 3/2016 | Raff |

(Continued)

FOREIGN PATENT DOCUMENTS

| | | |
|---|---|---|
| CN | 102117104 | 7/2011 |
| CN | 102455528 | 5/2012 |

(Continued)

OTHER PUBLICATIONS

International Search Report and Written Opinion, PCT/US2013/061770, dated Jan. 20, 2014.

*Primary Examiner* — Anthony Q Edwards
(74) *Attorney, Agent, or Firm* — Brownstein Hyatt Farber Schreck, LLP

(57) ABSTRACT

An enclosure for a portable computing device can include a cover glass affixed to an enclosure without trim pieces disposed between the cover glass and the disclosure. In one embodiment, the enclosure can include an edge profile that can define a relatively large contact pad about the enclosure. The contact pad can distribute impact forces over a relatively large area and thereby protect the cover glass integrity.

20 Claims, 6 Drawing Sheets

(56) References Cited

U.S. PATENT DOCUMENTS

| | | |
|---|---|---|
| 2010/0315769 A1 | 12/2010 | Mathew et al. |
| 2011/0005662 A1 | 1/2011 | Sung |
| 2011/0103041 A1 | 5/2011 | Mathew et al. |
| 2011/0287812 A1* | 11/2011 | Joo .................. H04M 1/185 455/566 |
| 2011/0305875 A1 | 12/2011 | Sanford et al. |
| 2012/0033357 A1 | 2/2012 | Dai et al. |
| 2012/0194998 A1 | 8/2012 | McClure et al. |
| 2013/0003270 A1* | 1/2013 | Kim ..................... G06F 3/041 361/679.01 |
| 2013/0128433 A1 | 5/2013 | Dannoux et al. |
| 2013/0279088 A1 | 10/2013 | Raff et al. |
| 2013/0329460 A1 | 12/2013 | Mathew |
| 2014/0092564 A1 | 4/2014 | Chuang |
| 2014/0111927 A1 | 4/2014 | Raff |
| 2015/0092334 A1 | 4/2015 | Hayashida |
| 2015/0198976 A1 | 7/2015 | Raff |

FOREIGN PATENT DOCUMENTS

| | | |
|---|---|---|
| CN | 102544887 | 7/2012 |
| CN | 202453764 | 9/2012 |
| EP | 1691263 | 8/2006 |
| JP | 2007036905 | 2/2007 |
| JP | 2010237493 | 10/2010 |
| KR | 20080084494 | 9/2008 |
| KR | 20100027546 | 3/2010 |
| KR | 20110032901 | 3/2011 |
| KR | 20120112746 | 10/2011 |
| KR | 20110127483 | 11/2011 |
| TW | 201140531 | 11/2011 |
| TW | M430143 | 5/2012 |
| WO | WO2011/084184 | 7/2011 |
| WO | WO2012/030563 | 3/2012 |
| WO | WO2012/064567 | 5/2012 |

* cited by examiner

TRIMLESS GLASS ENCLOSURE INTERFACE

CROSS-REFERENCE TO RELATED APPLICATION(S)

This application is a continuation patent application of U.S. patent application Ser. No. 15/887,961, filed Feb. 2, 2018 and titled "Trimless Glass Enclosure Interface," which is a continuation patent application of U.S. patent application Ser. No. 15/060,490, filed Mar. 3, 2016 and titled "Trimless Glass Enclosure Interface," now U.S. Pat. No. 9,886,065, which is a continuation patent application of U.S. patent application Ser. No. 14/668,799, filed Mar. 25, 2015 and titled "Trimless Glass Enclosure Interface," now U.S. Pat. No. 9,285,833, which is a continuation patent application of U.S. patent application Ser. No. 13/908,970, filed Jun. 3, 2013 and titled "Trimless Glass Enclosure Interface," now U.S. Pat. No. 9,047,044, which is a nonprovisional patent application of and claims the benefit under 35 U.S.C. 119(e) of U.S. Provisional Patent Application No. 61/715,970, filed Oct. 19, 2012 and titled "Trimless Glass Enclosure Interface," the disclosures of which are hereby incorporated herein by reference in their entireties.

FIELD

The described embodiments relate generally to enclosures for portable computing devices and more particularly to glass interfaces with enclosures for portable computing devices.

BACKGROUND

Portable computing devices such as media players or tablet computers typically include a generous display configured to show a user graphical output and oftentimes the display is combined with a touch sensitive input device that allows the user to control the portable computing device.

As portable computing devices become more compact, the enclosure design and the display must also become smaller. However, simply size reducing older designs can provide a product that may not provide adequate display area or may not adequately protect a cover glass attached to the portable computing device. Furthermore, conventional device enclosures include trim gaskets, trim pieces, or other trim-protective features which may decrease the aesthetics of a final device.

Therefore, what is desired is a portable computing device with an enclosure design that can be reduced in size, that can increase aesthetic qualities, and that will adequately protect the cover glass.

SUMMARY

This paper describes various embodiments that relate to enclosures for a portable computing device. In one embodiment, a method for attaching a cover glass to an enclosure of a portable computing device absent a trim piece disposed between the cover glass and the enclosure is disclosed. The method includes affixing a display assembly to the enclosure, applying an adhesive to the enclosure, and attaching the cover glass to the adhesive.

In another embodiment, an enclosure for a portable computing device can include a body formed from a single and continuous piece of aluminum, the body including a bottom an four side walls, where at least one side wall includes a profile including a curve and an apex where the apex is arranged to be located on a 45 degree slope below an upper corner of the body, an opening configured to receive internal components, a support ledge configured to receive an adhesive and a cover glass configured to fit within the opening and bond to the adhesive on the support ledge.

In another embodiment, a personal computing device is disclosed. The personal computing device may be a tablet computer, telephone, media player, or other computing device. The device may include a body formed from a single and continuous piece of aluminum. The body may include a bottom and at least one side wall. The at least one side wall includes a profile including a curve and an apex arranged to be located on a slope below an upper corner of the body. The body may further include a cavity configured to receive internal components, a support ledge configured to receive an adhesive, and a cover glass configured to fit within the opening and bond to the adhesive on the support ledge.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Figure 1:
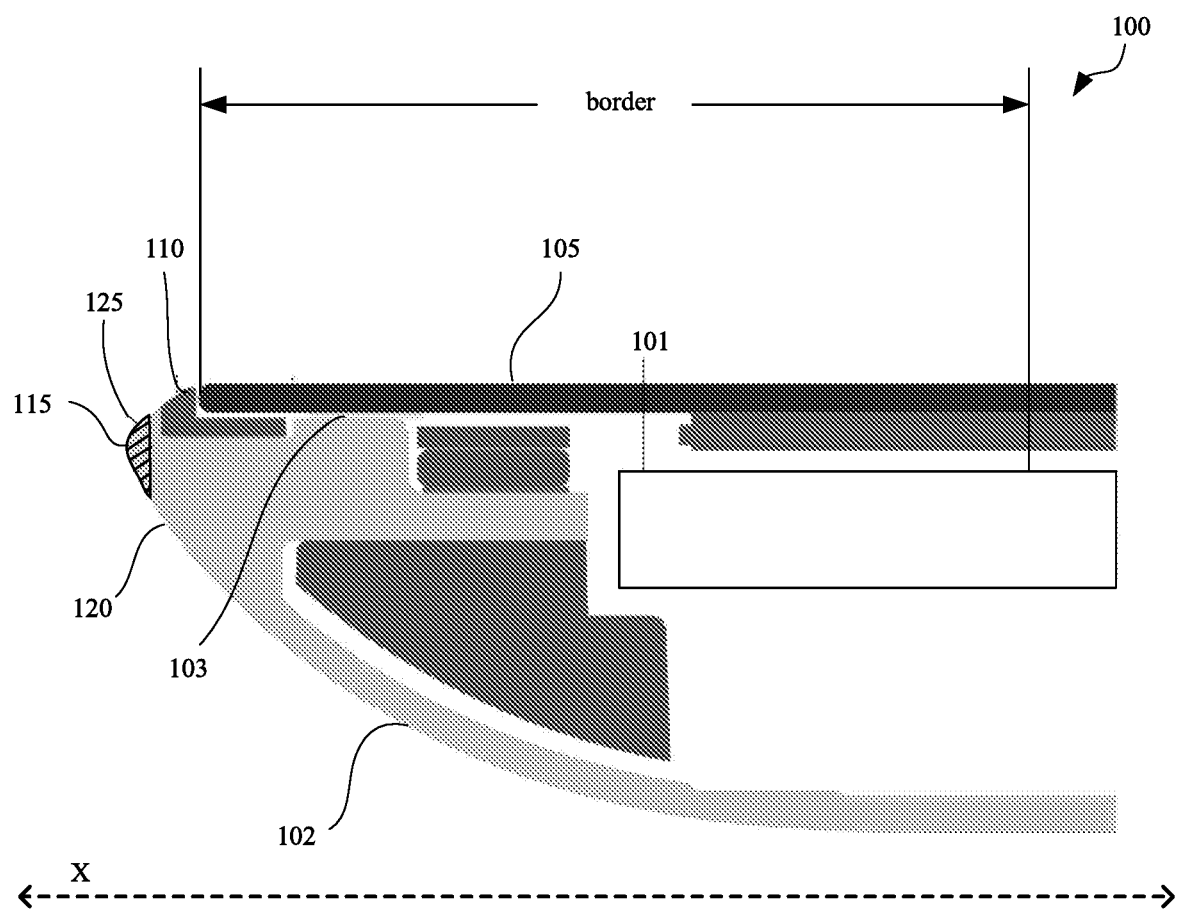
FIG. 1 (Prior Art) is a cross sectional view of a conventional portable computing device.

FIG. 1 is a cross sectional view of a conventional portable computing device 100. The portable computing device 100 can include an enclosure 102. The enclosure can form a cavity that can enclose various functional components for the portable computing device such as a battery, a processor, memory, wireless interfaces etc. The portable computing device 100 can include a display assembly 101 that can include a liquid crystal display, filters and a light source. The portable computing device 100 can include a cover glass 105 that can be attached to the enclosure 102 with an adhesive 103. Disposed between cover glass 105 and enclosure 102 is a trim piece 110. The trim piece 110 can absorb some shock that can be transmitted from enclosure 102 to cover glass 105 when portable computing device 100 is exposed to an impact along the X-axis as shown. Additionally trim piece 110 can be used to mask any tolerance build up problems that can be present in the design of portable computing device 100, particularly in the area of the interface between the cover glass 105 and the enclosure 102.

An impact along the X-axis can occur when portable computing device 100 falls and lands on or near apex 115. The edge profile 120 near apex 115 can define a narrow contact pad 125 (shown with cross hatched lines). A consequence of the narrow contact pad 125 is that forces subjected to the region of the narrow contact pad 125 are concentrated and can deliver a relatively sharper shock or impact in the region near narrow contact pad 125, such as near cover glass 105. In some cases, a blow or impact to the narrow contact pad 125 can cause damage to cover glass 105, even with trim piece 110 available to absorb a portion of the impact forces.

Figure 2:
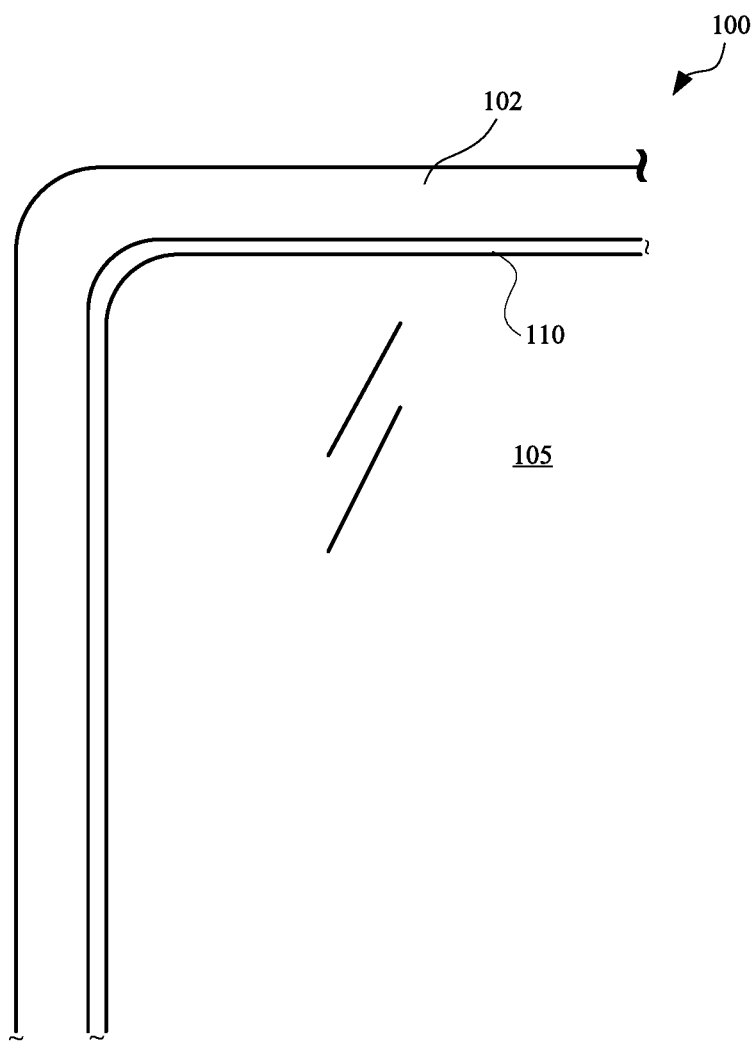
FIG. 2 (Prior Art) is a planar view of a portion of the computing device of FIG. 1.

FIG. 2 is a planar view of a portion of the device 100. As shown, the device 100, when viewed from above the cover glass 105, includes a clear view of the trim piece 110. The trim piece 110 extends about the cover glass 105, and therefore is seen while a user is manipulating or using device 100. As such, the trim piece 110 may detract from the overall aesthetic quality of device 100.

However, exemplary embodiments of the present invention provide methods and apparatuses which overcome these and other drawbacks, as described below.

Figure 3:
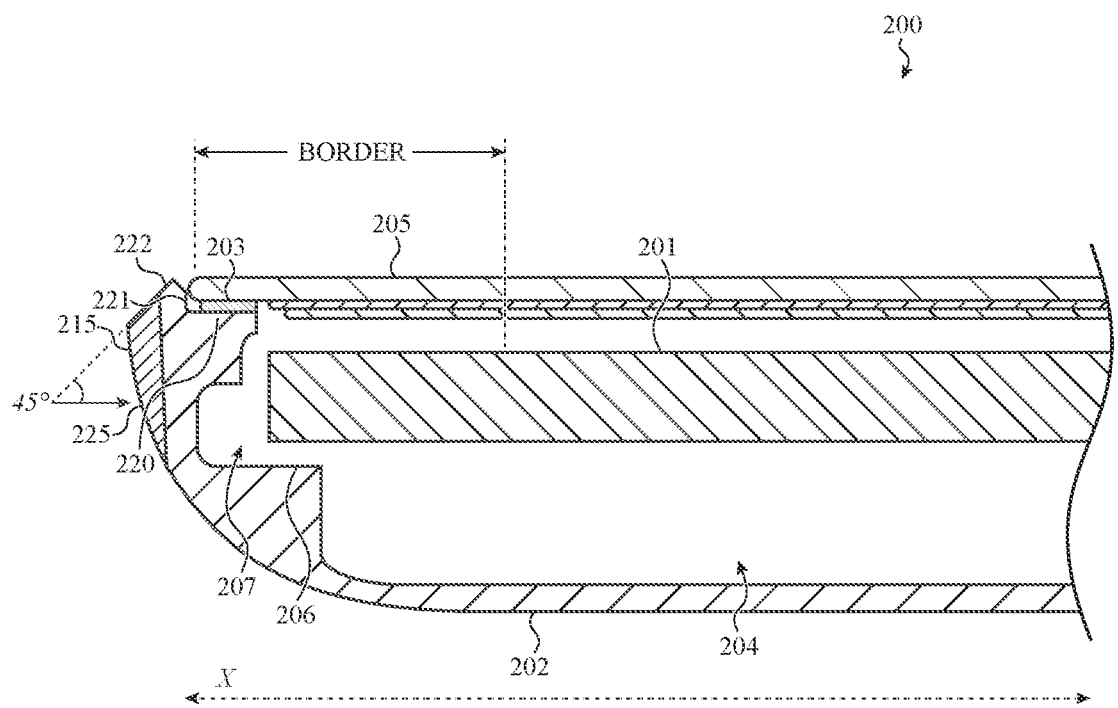
FIG. 3 is a cross sectional view of a portable computing device in accordance with an exemplary embodiment of the invention.

FIG. 3 is a cross sectional view of a portable computing device 200 in accordance with an exemplary embodiment of the invention. Portable computing device 200 can include an enclosure 202. The enclosure 202 can be formed from a resilient and sturdy material. In one embodiment, enclosure 202 can be formed from aluminum. Enclosure 202 can be shaped to form a cavity 204 to enclose and protect various components that can be included with the portable computing device 200 such as a processor, memory, wireless interfaces, battery, etc. As shown in FIG. 3, the enclosure 202 defines a lower ledge 206 and a recess 207 which is part of the cavity 204. Portable computing device can also include a display assembly 201 that can include a LCD display and a backlight. In one embodiment, the display assembly 201 can be configured to include a relatively smaller border area than conventional display assemblies. Smaller border areas can enable an active screen area to be affected to a lesser extent even when an overall size of the portable computing device 200 can be smaller than portable computing device 100.

Adhesive 203 can be disposed on a support ledge 220 formed within enclosure 202. In one embodiment adhesive 203 can bond a cover glass 205 to enclosure 202. The cover glass 205 can be bonded directly to enclosure 202 without any extra layers between cover glass 205 and enclosure 202 (such as trim piece 110 shown above). In one embodiment machining operations for the enclosure 202, especially operations for forming support ledge 220 and side wall 221 can be formed at relatively the same time thereby allowing relatively good control of tolerances associated with the opening configured to receive cover glass 205. Machining operations for cover glass 205 can also be well controlled enabling the cover glass 205 to fit relatively well with a highly controlled gap 223 between enclosure 202 and cover glass 205.

Enclosure 202 can include a gentle sweeping edge profile 225. The edge profile 225 can form a broad contact pad 215. The broad contact pad 215 can spread any impact forces received in this edge area over a relatively greater area than the narrow contact pad 125. This larger area can absorb and distribute impact forces through more of enclosure 202. The gentle sweeping edge profile 225 also provides a less prominent apex 235 in the edge area. The less prominent apex 235 can also help distribute impact forces received in the edge area. In one embodiment, apex 235 can be positioned on a 45 degree line emanating from top corner 222 of enclosure 202. In another embodiment, the apex 235 can be positioned on a line at a differing angle than that illustrated, according to any desired structural or aesthetic characteristics of a finished product.

According to one embodiment, device 200 weighs approximately 0.7 lbs. According to another embodiment, device 200 weighs less than about 0.7 lbs. According to yet another embodiment, the device 200 weighs less than about 1.4 lbs. Accordingly, the relatively low weight of device 200 further enhances the applicability of the edge profile 225, allowing for the clean lined top-down view without necessitating the additional trim piece 110 of device 100. However, in some embodiments, a trim piece somewhat similar to trim piece 110 may be included for additional protection of cover glass 205.

According to one embodiment, the gap 223 is approximately 0.05 mm According to another embodiment, the gap 223 is less than about 0.05 mm. According to yet another embodiment, the gap 223 is slightly larger than about 0.05 mm. Accordingly, the small size of the gap 223 allows for a desirable and clean interface between the enclosure 202 and display panel glass 205 further enhancing aesthetics of the device 200.

Figure 4:
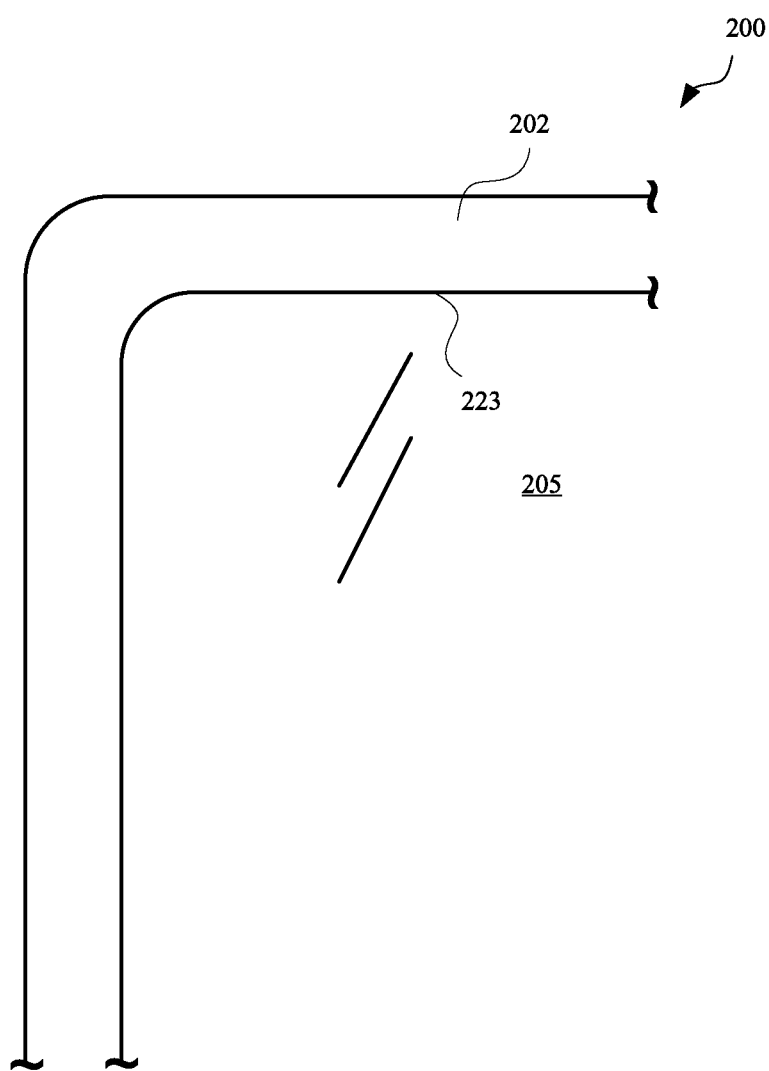
FIG. 4 is a planar view of a portion of the computing device of FIG. 3.

FIG. 4 is a planar view of a portion of the device 200. As shown, the device 200, when viewed from above the cover glass 205, includes a clean and desirable interface between cover glass 205 and enclosure 202, with only the relatively small gap 223 viewable. As such, the aesthetic quality of device 200 may be desirable.

Figure 5:
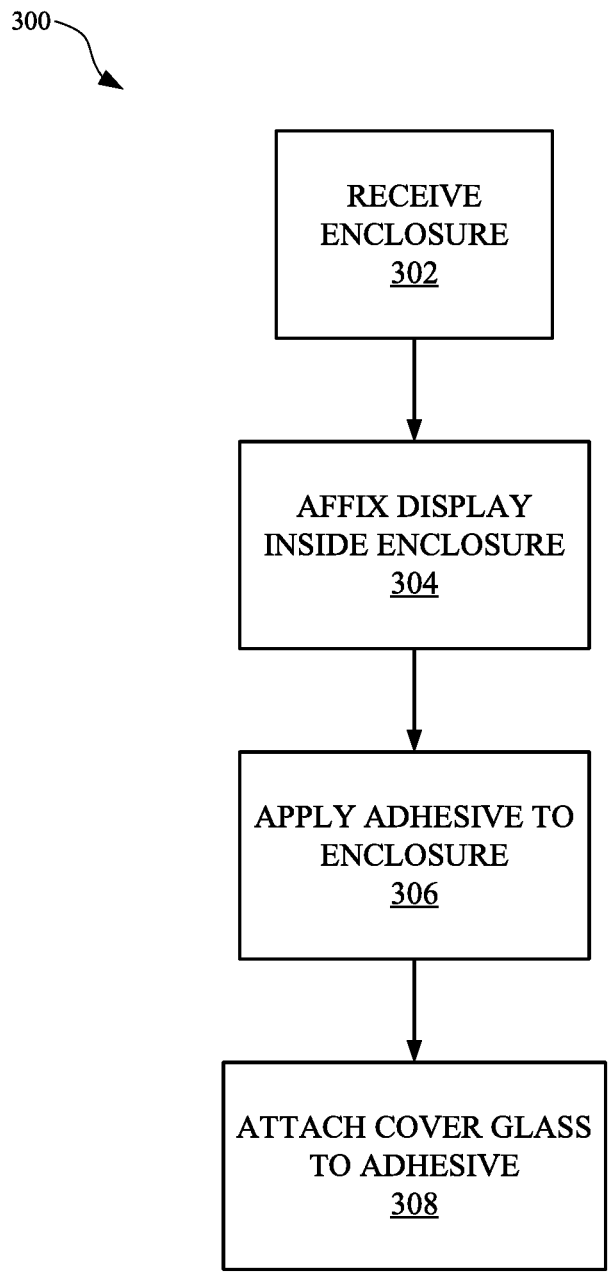
FIG. 5 is a flow chart of a method of forming a device in accordance with an exemplary embodiment of the invention.

FIG. 5 is a flow chart 300 of a method of forming a device similar to device 200, according to an exemplary embodiment of the invention. The method can begin in step 302 by receiving the enclosure 202. In step 304, a display assembly 201 can be mounted within the enclosure 202 and/or cavity 204. In step 306, adhesive 203 can be applied to the enclosure 202. In one embodiment, adhesive 203 can be applied to support ledge 220 on enclosure 202. In another embodiment, adhesive 203 can be a pressure sensitive adhesive. In yet another embodiment, adhesive 203 can be a compliant foam with a pressure sensitive adhesive applied on two sides of the compliant foam. In step 308, the cover glass 205 can be attached to the adhesive.

As described above, the enclosure 202 may be received, a display assembly mounted, and a cover glass attached. However, the same may be varied in many ways. For example, pressure sensitive adhesive may be applied in any step preceding application of the cover glass 205. Furthermore, machining, polishing, and other steps may also be applicable.

Figure 6:
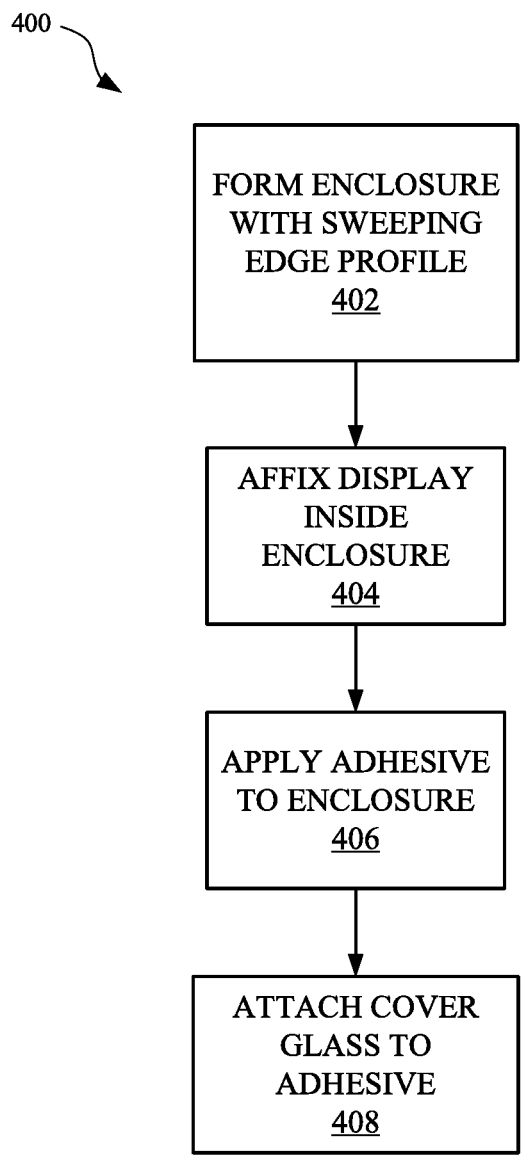
FIG. 6 is a flow chart of a method of forming a device in accordance with an exemplary embodiment of the invention.

For example, FIG. 6 is a flow chart of a method 400 of forming a device similar to device 200, according to an exemplary embodiment of the invention. The method 400 can begin in step 402 by forming the enclosure 202 with the sweeping edge profile 225 and associated sidewall 221 adjacent to support ledge 220. The forming may include forming the enclosure 202 from a single piece of aluminum, for example, using a machining device, cutting device, or any other suitable device to form the features described herein.

In step 404, a display assembly 201 can be mounted within the enclosure 202 and/or cavity 204. In step 406, adhesive 203 can be applied to the enclosure 202. In step 408, the cover glass 205 can be attached to the adhesive.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device comprising:
   a housing component of unitary construction defining:
      a support ledge;
      a lower ledge; and
      a recess extending underneath the support ledge and over the lower ledge;
   a display assembly extending over the lower ledge; and
   a cover coupled to the support ledge to define a gap between a side surface of the cover and an interior surface of the housing component.

2. The electronic device of claim 1, wherein the housing component further defines an exterior surface comprising:
   an upper corner;
   an upper portion outwardly sloped from the upper corner; and
   a lower portion adjoining the upper portion, thereby defining an obtuse angle between the upper portion and the lower portion.

3. The electronic device of claim 1, wherein a portion of the display assembly extends into the recess.

4. The electronic device of claim 1, wherein the interior surface of the housing component extends upward from the support ledge.

5. The electronic device of claim 1, wherein the display assembly comprises a touch sensitive input device below the cover.

6. The electronic device of claim 1, wherein the gap is less than 0.05 mm.

7. The electronic device of claim 1, wherein the housing component is machined from a single piece of aluminum.

8. An electronic device comprising:
   a housing component formed from a metal material and defining:
      a support ledge and an interior surface extending from the support ledge;
      a recess extending under the support ledge;
      a lower ledge extending underneath the support ledge and defining at least a portion of the recess; and
      an exterior surface comprising:
         an upper corner;
         an upper portion defining a slope extending outward from the upper corner; and
         a lower portion meeting the upper portion to define an obtuse angle;
   a cover, a periphery of the cover coupled to the support ledge and abutting the interior surface; and
   a display assembly extending over the lower ledge.

9. The electronic device of claim 8, wherein:
   an interior cavity of the electronic device comprises the recess; and
   the display assembly extends into the recess.

10. The electronic device of claim 8, wherein:
    the periphery of the cover defines a side surface; and
    the side surface of the cover abuts the interior surface.

11. The electronic device of claim 8, wherein the upper corner is coplanar with a front surface of the cover.

12. The electronic device of claim 8, wherein the display assembly is suspended from the cover.

13. The electronic device of claim 8, wherein the cover is in sheet form.

14. The electronic device of claim 8, wherein the cover is formed of glass.

15. An electronic device comprising:
    a housing component formed from a metal material and defining a set of sidewalls, the set of sidewalls defining:
       an opening configured to receive a cover;
       a support ledge;
       a lower ledge; and
       a recess extending under the support ledge and at least partially defined by the lower ledge;
    a display assembly positioned such that a portion of the display assembly extends over the lower ledge; and
    the cover positioned within the opening and coupled to the support ledge.

16. The electronic device of claim 15, wherein at least one sidewall of the set of sidewalls defines:
    an upper edge profile defining a bevel; and
    a lower edge profile meeting the upper edge profile at an obtuse angle.

17. The electronic device of claim 15, wherein a rear surface of the cover is positioned on the support ledge to define a gap between a side surface of the cover and an interior surface of at least one sidewall of the set of sidewalls.

18. The electronic device of claim 17, wherein the electronic device does not include an interstitial part within the gap.

19. The electronic device of claim 15, wherein the set of sidewalls includes four sidewalls.

20. The electronic device of claim 15, wherein an adhesive couples a rear surface of the cover to the support ledge.

\* \* \* \* \*